US012674710B2

(12) United States Patent
Curtis et al.

(10) Patent No.: US 12,674,710 B2
(45) Date of Patent: Jul. 7, 2026

(54) FLUID FITTING WITH INTEGRATED TEMPERATURE SENSOR

(71) Applicant: Dell Products L.P., Round Rock, TX (US)

(72) Inventors: Robert B. Curtis, Georgetown, TX (US); Richard M. Eiland, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 1035 days.

(21) Appl. No.: 17/850,076

(22) Filed: Jun. 27, 2022

(65) Prior Publication Data

US 2023/0417602 A1 Dec. 28, 2023

(51) Int. Cl.
*G01K 1/14* (2021.01)
*G01K 13/02* (2021.01)
*H05K 7/20* (2006.01)

(52) U.S. Cl.
CPC ............. *G01K 1/14* (2013.01); *G01K 13/026* (2021.01); *H05K 7/20272* (2013.01)

(58) Field of Classification Search
CPC ..... G01K 1/14; G01K 13/026; H05K 7/20272

USPC .......................................................... 374/208
See application file for complete search history.

(56) References Cited

U.S. PATENT DOCUMENTS

| | | | | |
|---|---|---|---|---|
| 4,987,749 | A * | 1/1991 | Baier | ...................... G01K 7/22 |
| | | | | 374/E13.006 |
| 8,177,425 | B2 * | 5/2012 | Grundmann | ........... G01K 13/02 |
| | | | | 374/185 |
| 2006/0045167 | A1 * | 3/2006 | Pawlenko | .............. G01K 13/02 |
| | | | | 374/E1.019 |
| 2020/0015383 | A1 * | 1/2020 | Gao | ................... H05K 7/20763 |

* cited by examiner

*Primary Examiner* — John E Breene
*Assistant Examiner* — Janice M Soto
(74) *Attorney, Agent, or Firm* — Jackson Walker L.L.P.

(57) ABSTRACT

A fluid fitting may include a housing having a fluidic channel formed within, configured to convey fluid between a first end of the housing and a second end of the housing, a temperature sensor configured to generate a signal indicative of a temperature of fluid flowing in the fluidic channel, and a wiring channel formed in the housing and configured to house at least a portion of an electrically-conductive path extending from the temperature sensor to the exterior of the housing, the electrically-conductive path configured to communicate the signal from the temperature sensor.

12 Claims, 6 Drawing Sheets

FLUID FITTING WITH INTEGRATED TEMPERATURE SENSOR

TECHNICAL FIELD

The present disclosure relates in general to information handling systems, and more particularly to integrating a temperature sensor within a fluid fitting of a liquid cooling system in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

To control temperature of components of an information handling system, an air mover may direct air over one or more heatsinks thermally coupled to individual components. Traditional approaches to cooling components may include a "passive" cooling system that serves to reject heat of a component to air driven by one or more system-level air movers (e.g., fans) for cooling multiple components of an information handling system in addition to the peripheral component. Another traditional approach may include an "active" cooling system that uses liquid cooling, in which a heat-exchanging cold plate is thermally coupled to the component, and a chilled fluid is passed through conduits internal to the cold plate to remove heat from the component.

Current liquid cooling cold plate assemblies do not enable direct measurement of a temperature of coolant fluid entering or exiting the cold plate. If known, such coolant fluid temperature could be used to provide the user or system management controller information about the health status of the liquid cooling system, including any issues with flow rate, leaks, and/or temperatures being outside of defined upper and lower bounds.

Existing solutions to measuring coolant fluid temperature include using thermowells wherein extra fluid fittings are utilized to add a temperature sensor to a fluid network. Such additional fluid fittings may create additional opportunities for undesirable leaks in the liquid cooling system.

SUMMARY

In accordance with the teachings of the present disclosure, the disadvantages and problems associated with existing approaches for measuring temperature of a coolant fluid in a liquid cooling system may be substantially reduced or eliminated.

In accordance with embodiments of the present disclosure, an information handling system may include an information handling resource and a liquid cooling system for providing cooling of the information handling resource, wherein the liquid cooling system includes a fluid fitting comprising a housing having a fluidic channel formed within, configured to convey fluid between a first end of the housing and a second end of the housing, a temperature sensor configured to generate a signal indicative of a temperature of fluid flowing in the fluidic channel, and a wiring channel formed in the housing and configured to house at least a portion of an electrically-conductive path extending from the temperature sensor to the exterior of the housing, the electrically-conductive path configured to communicate the signal from the temperature sensor.

In accordance with these and other embodiments of the present disclosure, a fluid fitting may include a housing having a fluidic channel formed within, configured to convey fluid between a first end of the housing and a second end of the housing, a temperature sensor configured to generate a signal indicative of a temperature of fluid flowing in the fluidic channel, and a wiring channel formed in the housing and configured to house at least a portion of an electrically-conductive path extending from the temperature sensor to the exterior of the housing, the electrically-conductive path configured to communicate the signal from the temperature sensor.

In accordance with these and other embodiments of the present disclosure, a method may include forming a housing with a fluidic channel within, configured to convey fluid between a first end of the housing and a second end of the housing, integrating a temperature sensor within the housing, the temperature sensor configured to generate a signal indicative of a temperature of fluid flowing in the fluidic channel, and forming a wiring channel in the housing, the wiring channel configured to house at least a portion of an electrically-conductive path extending from the temperature sensor to the exterior of the housing, the electrically-conductive path configured to communicate the signal from the temperature sensor.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
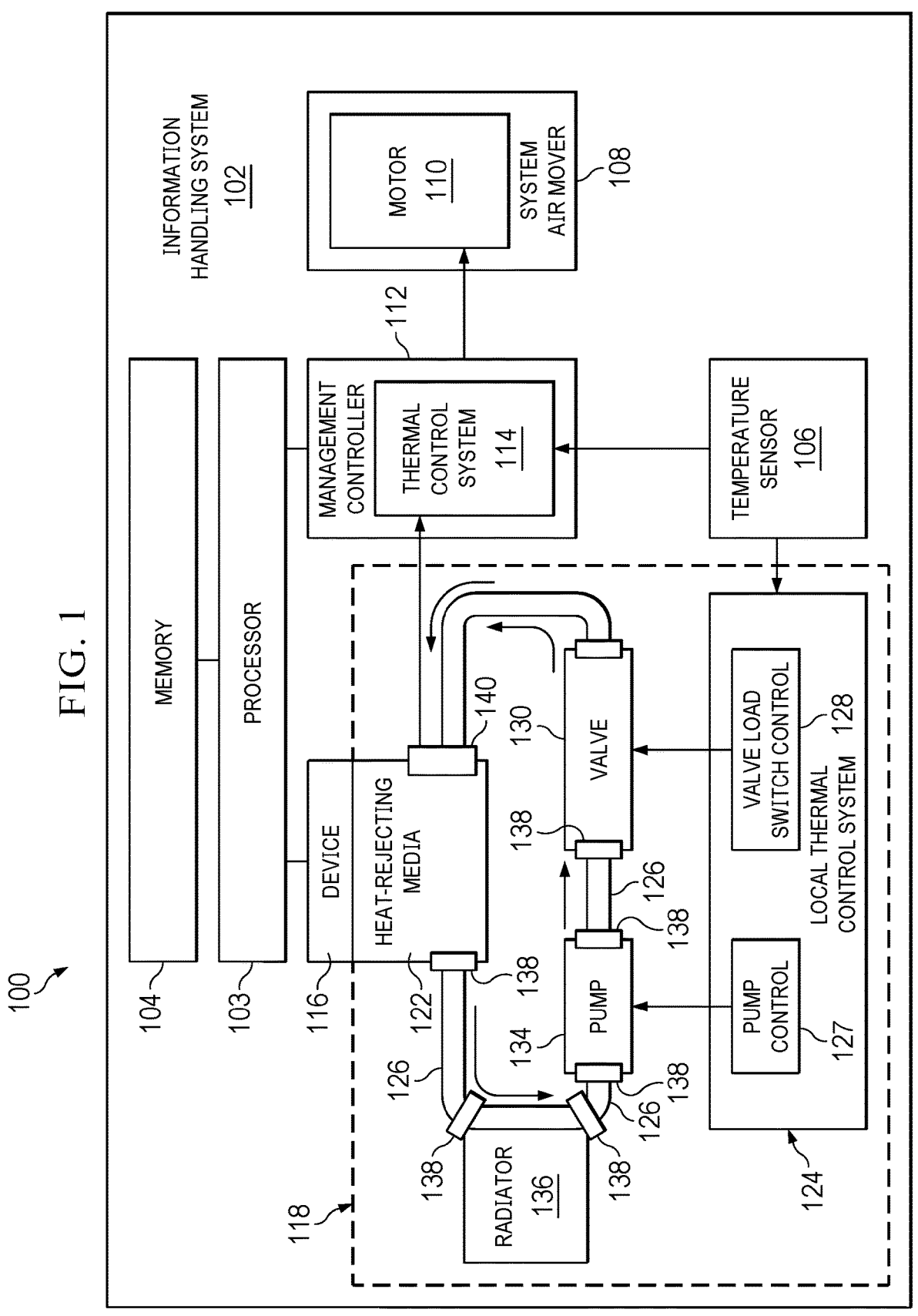
FIG. 1 illustrates a block diagram of selected components of an example information handling system, in accordance with embodiments of the present disclosure.

FIG. 1 illustrates a block diagram of selected components of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may include a chassis 100 housing a processor 103, a memory 104, a temperature sensor 106, a system air mover 108, a management controller 112, a device 116, and an active liquid cooling system 118.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

System air mover 108 may include any mechanical or electro-mechanical system, apparatus, or device operable to move air and/or other gases in order to cool information handling resources of information handling system 102. In some embodiments, system air mover 108 may comprise a fan (e.g., a rotating arrangement of vanes or blades which act on the air). In other embodiments, system air mover 108 may comprise a blower (e.g., a centrifugal fan that employs rotating impellers to accelerate air received at its intake and change the direction of the airflow). In these and other embodiments, rotating and other moving components of system air mover 108 may be driven by a motor 110. The rotational speed of motor 110 may be controlled by an air mover control signal communicated from thermal control system 114 of management controller 112. In operation, system air mover 108 may cool information handling resources of information handling system 102 by drawing cool air into an enclosure housing the information handling resources from outside the chassis, expel warm air from inside the enclosure to the outside of such enclosure, and/or move air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a thermal control system 114. Thermal control system 114 may include any system, device, or apparatus configured to receive one or more signals indicative of one or more temperatures within information handling system 102 (e.g., one or more signals from one or more temperature sensors 106), and based on such signals, calculate an air mover driving signal to maintain an appropriate level of cooling, increase cooling, or decrease cooling, as appropriate, and communicate such air mover driving signal to system air mover 108. In these and other embodiments, thermal control system 114 may be configured to receive information from other information handling resources and calculate the air mover driving signal based on such received information in addition to temperature information. For example, as described in greater detail below, thermal control system 114 may receive configuration data from device 116 and/or other information handling resources of information handling system 102, which may include thermal requirement information of one or more information handling resources. In addition to temperature information collected from sensors within information handling system 102, thermal control system 114 may also calculate the air mover driving signal based on such information received from information handling resources.

Temperature sensor 106 may be any system, device, or apparatus (e.g., a thermometer, thermistor, etc.) configured to communicate a signal to processor 103 or another controller indicative of a temperature within information handling system 102. In many embodiments, information handling system 102 may comprise a plurality of temperature sensors 106, wherein each temperature sensor 106 detects a temperature of a particular component and/or location within information handling system 102.

Device 116 may comprise any component information handling system of information handling system 102, including without limitation processors, buses, memories, I/O devices and/or interfaces, storage resources, network interfaces, motherboards, integrated circuit packages; electro-mechanical devices, displays, and power supplies.

Oftentimes, an architecture of information handling system 102 may be such that device 116 may be significantly downstream of system air mover 108, and that it may be significantly more effective for device 116 to be cooled using active liquid cooling system 118. As shown in FIG. 1, active liquid cooling system 118 may include a local thermal control system 124, heat-rejecting media 122, pump 134, radiator 136, valve 130, and fluidic conduits 126.

For purposes of clarity and exposition, the entirety of active liquid cooling system 118 is shown in FIG. 1 to be within chassis 100 of information handling system 102. However, in some embodiments, one or more components of active liquid cooling system 118 may be external to chassis 100 (e.g., as part of an external cooling distribution system).

Local thermal control system 124 may be communicatively coupled to temperature sensor 106, and may include any system, device, or apparatus (e.g., a processor, controller, etc.) configured to control components of an active liquid cooling system for reducing a temperature of one or more information handling resources of information handling system 102. For example, local thermal control system 124 may be configured to control pump 134 and/or valve 130 based on thermal data sensed by temperature sensor 106, so as to maintain a safe operating temperature for one or more information handling resources. Accordingly, local thermal control system 124 may include a pump control subsystem 127 for controlling operation of pump 134 (e.g., a pressure applied to coolant fluid in fluidic conduits 126 for moving such fluid through fluidic conduits 126) and a valve load switch control subsystem 128 for controlling operation of valve 130 (e.g., opening or closing valve 130, controlling an aperture of valve 130, etc.).

Pump 134 may be fluidically coupled to one or more fluidic conduits 126 and may comprise any mechanical or electro-mechanical system, apparatus, or device operable to produce a flow of fluid (e.g., fluid in one or more conduits 126). For example, pump 134 may produce fluid flow by applying a pressure to fluid in fluidic conduits 126. As described above, operation of pump 134 may be controlled by pump control subsystem 127 which may control electro-mechanical components of pump 134 in order to produce a desired rate of coolant flow.

Radiator 136 may include any device, system or apparatus configured to transfer thermal energy from one medium (e.g., fluid within a fluidic conduit 126) to another (e.g., air external to chassis 100) for the purpose of cooling and heating. In some embodiments, radiator 136 may include fluidic channels and/or conduits in at least a portion of radiator 136. Such fluidic channels and/or conduits may be fluidically coupled to one or more of fluidic conduits 126 and pump 134.

Valve 130 may include any device, system or apparatus that regulates, directs, and/or controls the flow of a fluid (e.g., a coolant liquid in fluidic conduits 126) by opening, closing, or partially obstructing one or more passageways. When valve 130 is open, coolant liquid may flow in a direction from higher pressure to lower pressure. As described above, the operation of valve 130 (e.g., opening and closing, size of an aperture of valve 130) may be controlled by valve load switch control subsystem 128.

In operation, pump 134 may induce a flow of liquid (e.g., water, ethylene glycol, propylene glycol, or other coolant) through various fluidic conduits 126 of information handling system 102, valve 130 and/or radiator 136. As fluid passes by heat-rejecting media 122 in a fluidic conduit 126 proximate to device 116, heat may be transferred from device 116 to heat-rejecting media 122 and from heat-rejecting media 122 to the liquid coolant in fluidic conduit 126. As such heated coolant flows by radiator 136, heat from the coolant may be transferred from the coolant to air ambient to chassis 100, thus cooling the fluid. In other embodiments, radiator 136 may use liquid-to-liquid cooling, in which liquid-to-liquid heat exchangers transfer heat from the coolant fluid of active liquid cooling system 118 to a coolant fluid of another liquid cooling loop.

Heat-rejecting media 122 may include any system, device, or apparatus configured to transfer heat from an information handling resource (e.g., device 116, as shown in FIG. 1), thus reducing a temperature of the information handling resource. For example, heat-rejecting media 122 may include a solid thermally coupled to the information handling resource (e.g., cold plate, heatpipe, heat spreader, heatsink, finstack, etc.) such that heat generated by the information handling resource is transferred from the information handling resource.

As depicted in FIG. 1, fluidic conduits 126 may be fluidically coupled to other components of active liquid cooling system 118 via fluid fittings 138 and/or fluid fittings 140 having an integrated temperature sensor. Each of fluid fittings 138 and 140 may include any suitable system, device, or apparatus configured to create a substantially leak-proof fluid connection between a fluidic conduit 126 and another component of active liquid cooling system 118 through which coolant fluid may flow. For example, in some embodiments, one or more of fluid fittings 138 and 140 may comprise a quick disconnect fluid fitting used to provide a fast, make-or-break connection between fluid transfer lines. In some instances, one or more of such quick disconnect fluid fittings may be equipped with self-sealing valves, such that such a quick disconnect fluid fitting may, upon disconnection, automatically contain any fluid in the fluid line that remains connected to the quick disconnect fluid fitting.

As indicated above, fluid fitting 140 may include an integrated temperature sensor. Some embodiments may integrate a direct electrical connection for the sensor into a housing of the fluid fitting for electrical coupling to a monitoring system (e.g., thermal control system 114). Because many fluid fitting assemblies are made, at least in part, from metal, such fluid fitting assemblies may often be very close in temperature to the coolant fluid conveyed through the fluid fitting sensor. Thus, as described below, in some embodiments the temperature sensor can be embedded in the body of fluid fitting 140 without breaching the liquid flow passage of fluid fitting, similar to a thermowell. In other embodiments, as also described below, the temperature sensor may be directly exposed to the coolant fluid flow for direct measurement of the coolant fluid temperature.

Although, for purposes of clarity and exposition, FIG. 1 depicts only a single fluid fitting 140 having an integrated temperature sensor, it is understood that one or more of fluid fittings 138 shown in FIG. 1 may be, in addition to or in lieu of fluid fitting 140 shown in FIG. 1, substituted for a fluid fitting 140 having an integrated temperature sensor.

Furthermore, although the foregoing depicts fluid fittings 138 and 140 as quick disconnect fluid fittings, it is understood that temperature sensors may be integrated within any suitable type of fluid fitting, including without limitation as part of a hose assembly of a fluidic conduit 126, integrated within heat-rejecting media 122 (e.g., within right-angle fittings of a cold plate), integrated within valve 130, integrated within pump 134, and integrated within radiator 136.

In addition to processor 103, memory 104, temperature sensor 106, air mover 108, management controller 112, device 116, and active liquid cooling system 118, information handling system 102 may include one or more other information handling resources. In addition, for the sake of clarity and exposition of the present disclosure, FIG. 1 depicts only one system air mover 108 and one device 116. In embodiments of the present disclosure, information handling system 102 may include any number of system air movers 108 and devices 116. Furthermore, for the sake of clarity and exposition of the present disclosure, FIG. 1 depicts device 116 including an active liquid cooling system 118 for active cooling of device 116. However, in some embodiments, approaches similar or identical to those used to actively cool device 116 as described herein may be employed to provide active cooling of processor 103, memory 104, management controller 112, and/or any other information handling resource of information handling system 102.

Advantageously, the use of fluid fitting 140 with an integrated temperature sensor may enable implementation of a liquid cooling system capable of detecting the temperature of coolant fluid without the need for thermowells or additional components that may introduce potential leak points beyond those already incident in fluid fittings of the liquid cooling system.

Figure 2A:
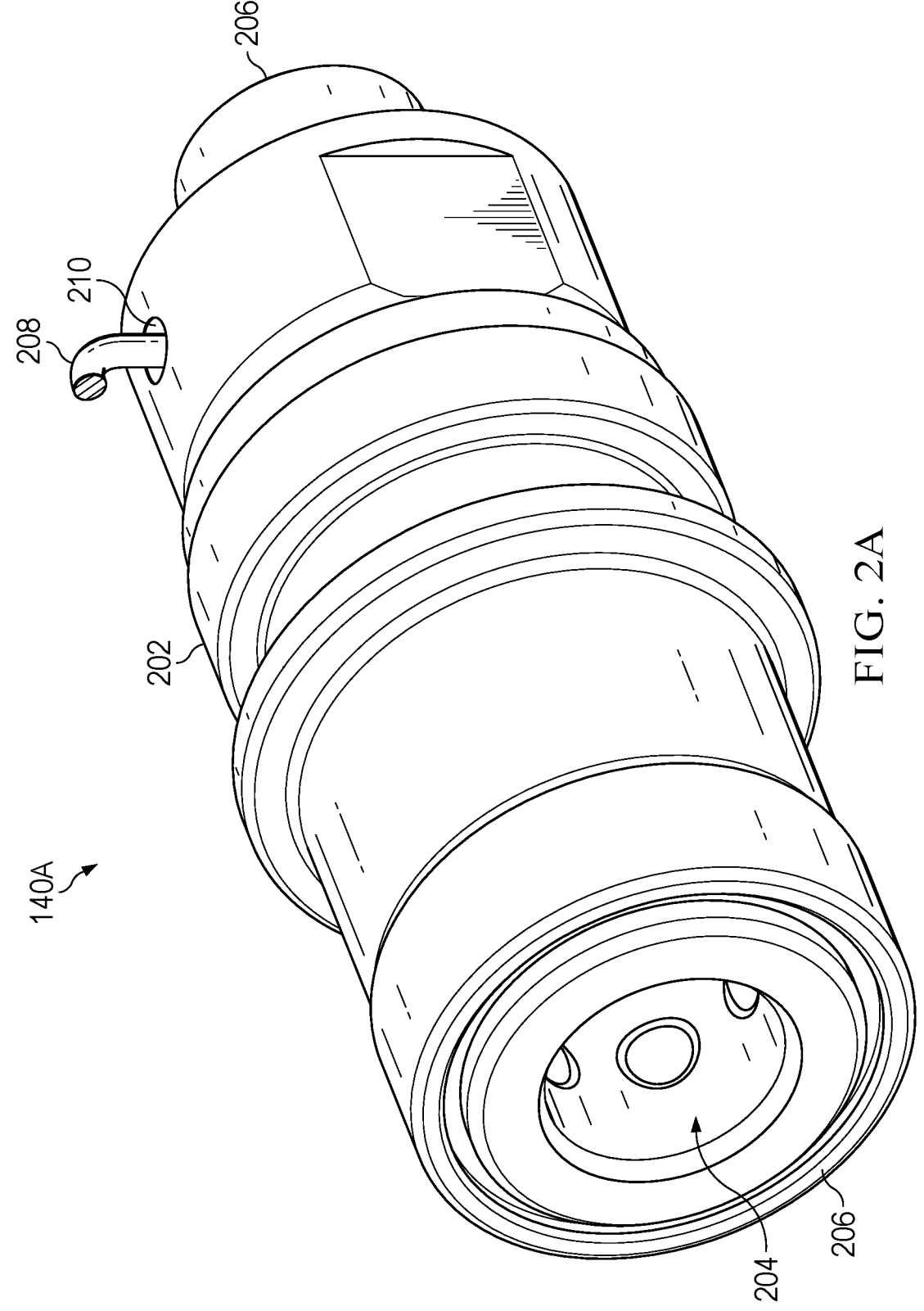
FIG. 2A illustrates an isometric perspective view of an example fluid fitting with an integrated temperature sensor, in accordance with embodiments of the present disclosure.
Figure 2B:
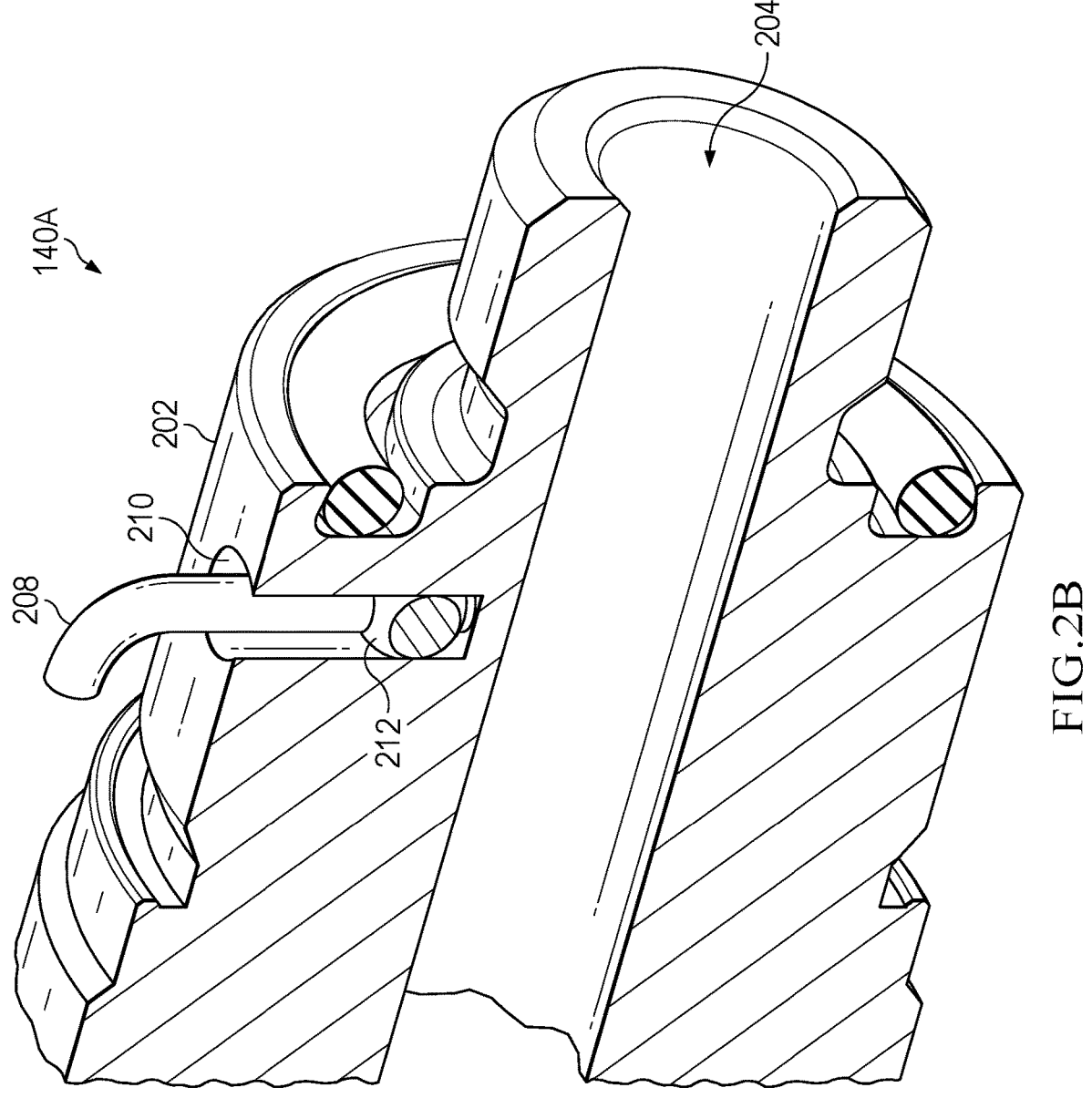
FIG. 2B illustrates an isometric perspective view of the example fluid fitting of FIG. 2A with portions cut away for illustrative purposes, in accordance with embodiments of the present disclosure.

FIG. 2A illustrates an isometric perspective view of an example fluid fitting 140A with an integrated temperature sensor, in accordance with embodiments of the present disclosure. FIG. 2B illustrates an isometric perspective view of example fluid fitting 140A depicted in FIG. 2A, with selected portions of body 202 cut away to show particular detail, in accordance with embodiments of the present disclosure.

As shown in FIGS. 2A and 2B, fluid fitting 140A may include a housing 202 of metal or any other suitable material, which may be generally of cylindrical shape with a fluidic channel 204 formed within housing 202 through which a fluid may pass between ends 206 of fluid fitting 140A. As also shown in FIGS. 2A and 2B, fluid fitting 140A may have a wiring channel 210 formed within body 202 through which an electrically-conductive wire 208 may pass from the exterior of housing 202 to a temperature sensor 212 located proximate to (but not in direct contact with) fluidic channel 204 and integrated within body 202.

Wire 208 may be constructed from any suitable electrically-conductive material (e.g., metal), and in some instances may be insulated with electrically-insulative material to electrically isolate wire 208 from body 202. In some embodiments, wire 208 may be integral to a cable including a plurality of electrically-conductive wires. In operation, wire 208 may communicate electrical signals from temperature sensor 212 integrated within fluid fitting 140A, wherein such electrical signals are indicative of a temperature sensed by temperature sensor 212. For example, such electrical signals may be communicated from temperature sensor 212 to a monitoring system (e.g., thermal control system 114) via wire 208.

Figure 3:
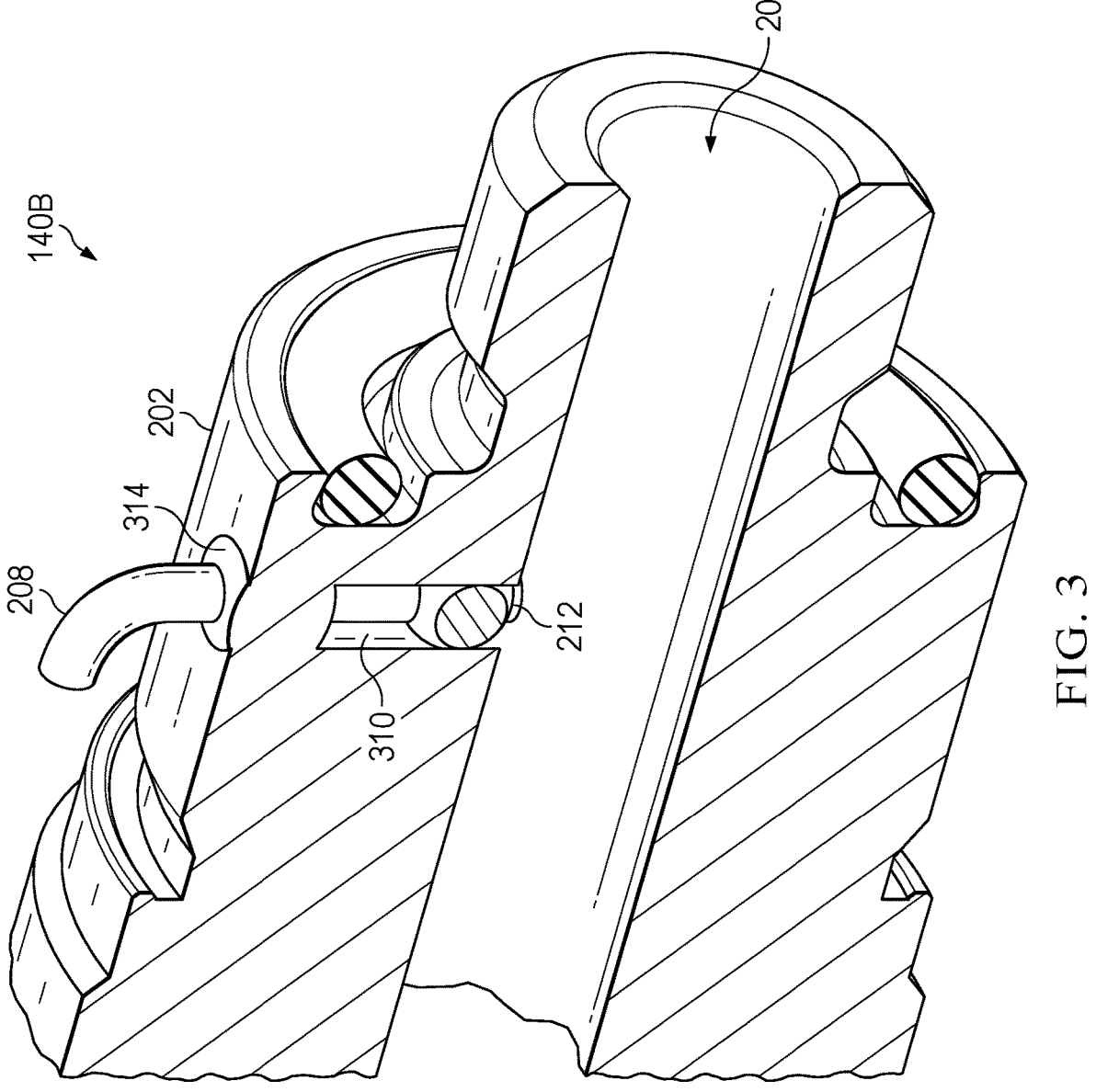
FIG. 3 illustrates an isometric perspective cut-away view of another example fluid fitting with an integrated temperature sensor, in accordance with embodiments of the present disclosure.

FIG. 3 illustrates an isometric perspective cut-away view of an example fluid fitting 140B with an integrated temperature sensor, in accordance with embodiments of the present disclosure. Fluid fitting 140B depicted in FIG. 3 may be similar in many respects to fluid fitting 140A depicted in FIGS. 2A and 2B. Accordingly, only key differences between fluid fitting 140B and fluid fitting 140A may be described below.

For example, fluid fitting 140B may include wiring channel 310 in lieu of wiring channel 210, wherein wiring channel 310 may open to fluidic channel 204, allowing temperature sensor 212 to be in direct contact with fluid present within fluidic channel 204. In such embodiment, because fluid within fluidic channel 204 may enter wiring channel 310, wiring channel 310 may include a seal 314 formed therein (e.g., at or proximate to the surface of the exterior of housing 202), formed of any suitable material (e.g., silicone, epoxy, etc.), and configured to prevent leakage of fluid from fluidic channel 204 to the exterior of housing 202 via wiring channel 310.

Figure 4A:
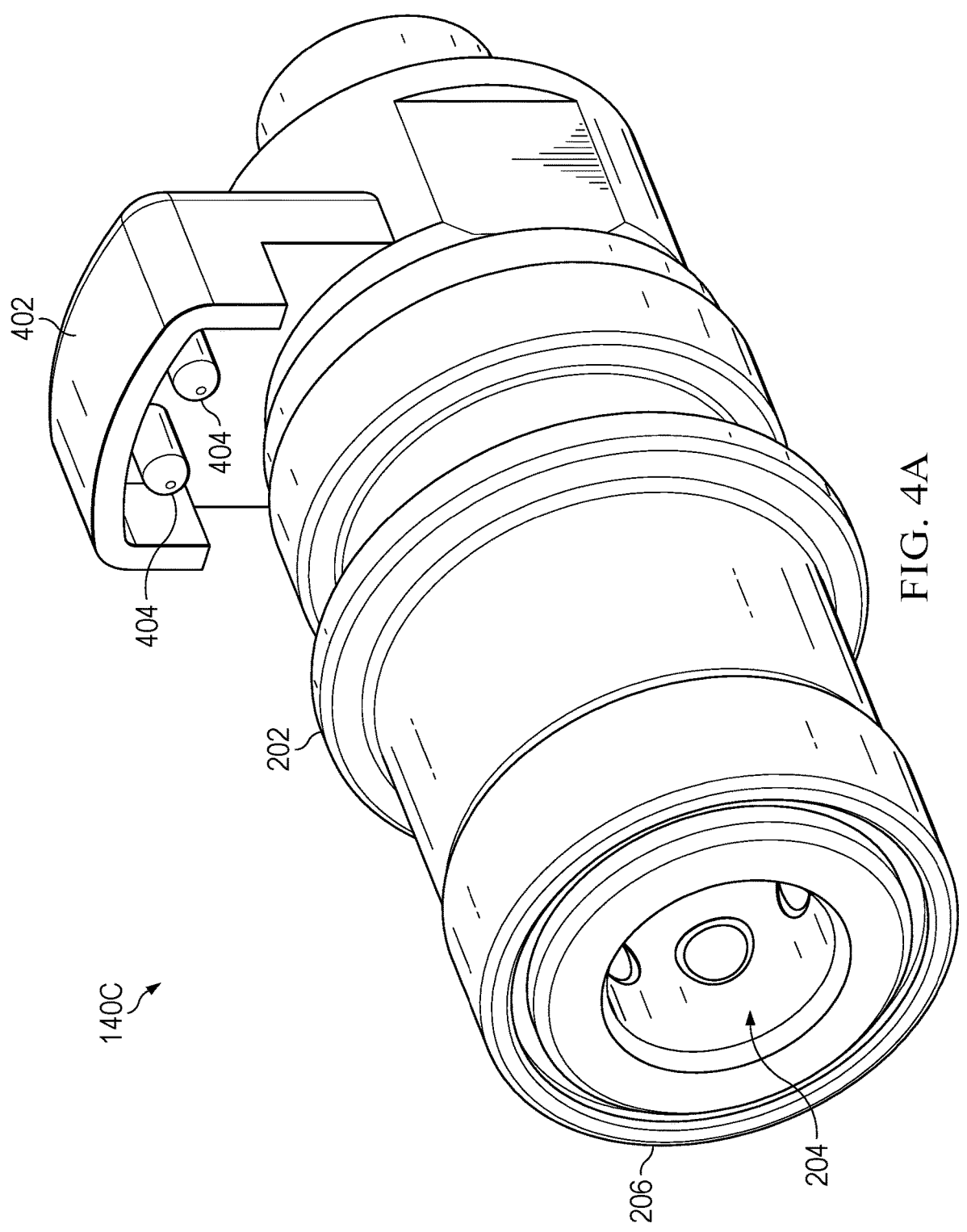
FIG. 4A illustrates an isometric perspective view of an example fluid fitting with an integrated temperature sensor and integrated sensor connector, in accordance with embodiments of the present disclosure.
Figure 4B:
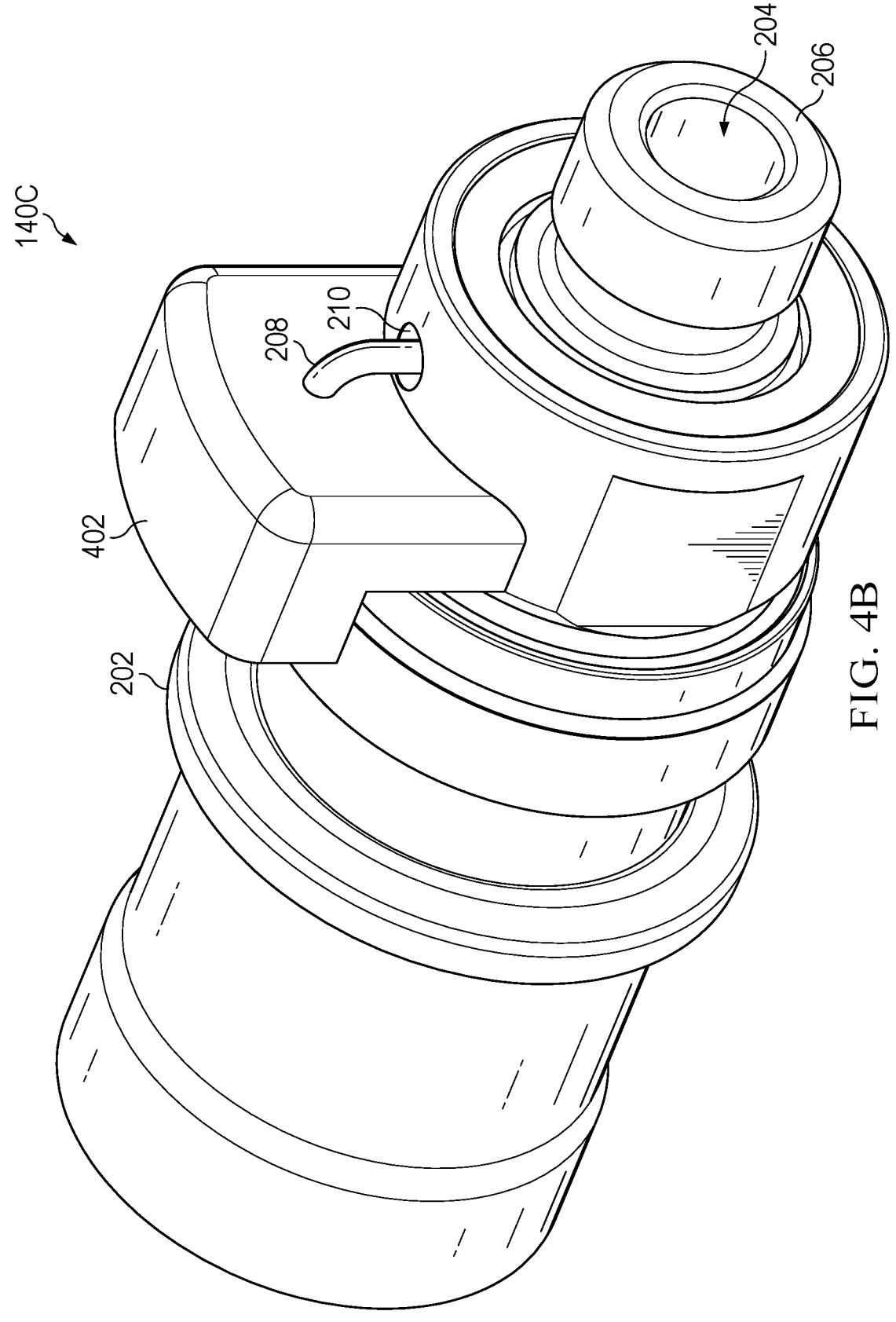
FIG. 4B illustrates another isometric perspective view of the example fluid fitting of FIG. 4A, in accordance with embodiments of the present disclosure.

FIG. 4A illustrates an isometric perspective view of an example fluid fitting 140C with an integrated temperature sensor and integrated sensor connector, in accordance with embodiments of the present disclosure. FIG. 4B illustrates another isometric perspective view of fluid fitting 140C, in accordance with embodiments of the present disclosure. Fluid fitting 140C depicted in FIGS. 4A and 4B may be similar in many respects to fluid fitting 140A depicted in FIGS. 2A and 2B. Accordingly, only key differences between fluid fitting 140C and fluid fitting 140A may be described below.

For example, fluid fitting 140C may include a cable connector 402 that includes a plug including one or more electrically-conductive prongs 404 for coupling a cable having one or more electrically-conductive wires to wire 208 via such one or more prongs 404. For example, such cable may be used to couple a temperature sensor (not expressly depicted in FIGS. 4A and 4B) integrated within fluid fitting 140C to a monitoring system (e.g., thermal control system 114) via prongs 404 and wire 208.

Although wire 208 is shown in FIG. 4B to be exposed, in some embodiments, all or a portion of wire 208 may be integrated within cable connector 402.

Further, although fluid fitting 140C is depicted in FIGS. 4A and 4B to include wiring channel 210 formed within body 202 through which electrically-conductive wire 208 may pass from the exterior of housing 202 to a temperature sensor located proximate to (but not in direct contact with) fluidic channel 204 and integrated within body 202 (e.g., similar to fluid fitting 140A), in some embodiments, fluid fitting 140C may include wiring channel 310 in lieu of wiring channel 210, wherein wiring channel 310 may open to fluidic channel 204, allowing temperature sensor 212 to be in direct contact with fluid present within fluidic channel 204, and may also include a seal 314, similar to that depicted in FIG. 3.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:

an information handling resource; and a liquid cooling system for providing cooling of the information handling resource, wherein the liquid cooling system includes a fluid fitting comprising:

a housing having a fluidic channel formed within, configured to convey fluid between a proximate end of the housing and a distal end of the housing, wherein the proximate end and the distal end of the housing are each configured to mechanically couple to a fluid line;

a temperature sensor configured to generate a signal indicative of a temperature of fluid flowing in the fluidic channel; and a wiring channel formed in the housing and configured to house at least a portion of an electrically-conductive path extending from the temperature sensor to an exterior of the housing, the electrically-conductive path configured to communicate the signal from the temperature sensor, wherein the wiring channel is fluidically coupled to the fluidic channel.

2. The information handling system of claim 1, the fluid fitting further comprising a seal configured to prevent fluid from flowing from the fluidic channel to the exterior of the housing via the wiring channel.

3. The information handling system of claim 1, wherein the electrically-conductive path comprises a wire extending from the temperature sensor to the exterior of the housing via the wiring channel.

4. The information handling system of claim 1, wherein the electrically-conductive path comprises a cable connector mechanically coupled to the housing and configured to terminate a wire extending from the temperature sensor and via the wiring channel.

5. A fluid fitting comprising:

a housing having a fluidic channel formed within, configured to convey fluid between a proximate end of the housing and a distal end of the housing, wherein the proximate end and the distal end of the housing are each configured to mechanically couple to a fluid line;

a temperature sensor configured to generate a signal indicative of a temperature of fluid flowing in the fluidic channel; and a wiring channel formed in the housing and configured to house at least a portion of an electrically-conductive path extending from the temperature sensor to the exterior of the housing, the electrically-conductive path configured to communicate the signal from the temperature sensor, wherein the wiring channel is fluidically coupled to the fluidic channel.

6. The fluid fitting of claim 5, further comprising a seal configured to prevent fluid from flowing from the fluidic channel to the exterior of the housing via the wiring channel.

7. The fluid fitting of claim 5, wherein the electrically-conductive path comprises a wire extending from the temperature sensor to the exterior of the housing via the wiring channel.

8. The fluid fitting of claim 5, wherein the electrically-conductive path comprises a cable connector mechanically coupled to the housing and configured to terminate a wire extending from the temperature sensor and via the wiring channel.

9. A method comprising:

forming a housing with a fluidic channel within, configured to convey fluid between a proximate end of the housing and a distal end of the housing, wherein the proximate end and the distal end of the housing are each configured to mechanically couple to a fluid line;

integrating a temperature sensor within the housing, the temperature sensor configured to generate a signal indicative of a temperature of fluid flowing in the fluidic channel; and forming a wiring channel in the housing, the wiring channel configured to house at least a portion of an electrically-conductive path extending from the temperature sensor to the exterior of the housing, the electrically-conductive path configured to communicate the signal from the temperature sensor, further comprising fluidically coupling the wiring channel to the fluidic channel.

10. The method of claim 9, further comprising disposing a seal in the wiring channel in order to prevent fluid from flowing from the fluidic channel to the exterior of the housing via the wiring channel.

11. The method of claim 9, wherein the electrically-conductive path comprises a wire extending from the temperature sensor to the exterior of the housing via the wiring channel.

12. The method of claim 9, wherein the electrically-conductive path comprises a cable connector mechanically coupled to the housing and configured to terminate a wire extending from the temperature sensor and via the wiring channel.

* * * * *